(12) United States Patent
Mullins, Jr. et al.

(10) Patent No.: US 6,381,716 B2
(45) Date of Patent: *Apr. 30, 2002

(54) SYSTEM AND METHOD FOR TESTING DEVICES SENSITIVE TO MAGNETIC FIELDS

(75) Inventors: Paul V. Mullins, Jr., Salem; Matthew H. Gaug, Londonderry, both of NH (US)

(73) Assignee: Analog Devices, Inc., Norwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/991,501

(22) Filed: Dec. 16, 1997

(51) Int. Cl.$^7$ ................................................ G01R 31/28
(52) U.S. Cl. ........................ 714/724; 365/201; 324/261
(58) Field of Search ................................ 714/718, 724; 324/158.1, 244.1, 96, 225, 529, 312, 239, 763, 209, 262, 765, 95, 322, 537, 760, 222, 240, 227; 702/38; 73/629, 779; 414/226.01; 439/620, 69, 912; 365/201; 369/44, 29; 29/834, 832

(56) References Cited

U.S. PATENT DOCUMENTS

| | | | | |
|---|---|---|---|---|
| 3,579,099 A | * | 5/1971 | Kanbayashi | 324/235 |
| 3,964,296 A | * | 6/1976 | Matzuk | 73/607 |
| 4,127,035 A | * | 11/1978 | Vasile | 73/629 |
| 4,321,535 A | * | 3/1982 | Allen | 324/209 |
| 4,641,093 A | * | 2/1987 | Melgui et al. | 324/239 |
| 4,651,116 A | * | 3/1987 | Schloemann | 333/235 |
| 4,745,809 A | * | 5/1988 | Collins et al. | 73/661 |
| 4,821,204 A | * | 4/1989 | Huschelrath | 702/38 |
| 4,866,374 A | * | 9/1989 | Cedrone | 324/537 |
| 5,126,669 A | * | 6/1992 | Honess et al. | 324/261 |
| 5,307,011 A | * | 4/1994 | Tani | 324/158.1 |
| 5,402,066 A | * | 3/1995 | Hickman, Jr. et al. | 324/242 |
| 5,517,119 A | * | 5/1996 | Weinstock et al. | 324/312 |
| 6,064,220 A | * | 5/2000 | Sugasawara et al. | 324/765 |
| 6,087,842 A | * | 7/2000 | Parker et al. | 324/763 |

OTHER PUBLICATIONS

Hardy, J. (High Frequency Circuit Design; 1979; pp. 25–43.).*

* cited by examiner

Primary Examiner—Phung M. Chung
Assistant Examiner—Guy J Lamarre
(74) Attorney, Agent, or Firm—Hale and Dorr LLP

(57) ABSTRACT

A high permeability magnetic core structure introduces a magnetic field to an intergrated circuit during testing. The magnetic core is mounted in an automatic tester and is integrated into the mechanical test site assembly that holds the integrated circuit in place during testing. Wound wire coils, mounted on the core structure, generate the magnetic field that is used for the test.

20 Claims, 4 Drawing Sheets

SYSTEM AND METHOD FOR TESTING DEVICES SENSITIVE TO MAGNETIC FIELDS

BACKGROUND OF THE INVENTION

Devices such as integrated circuits that have circuitry and/or structures for sensing a magnetic field should be tested by applying a known magnetic field and measuring an output signal to determine whether an actual output signal is sufficiently close to an expected output signal. One way to perform such testing is to use a coil in a bench test. This process allows testing in a carefully controlled testing environment, but is labor intensive and not suitable for testing large numbers of devices. It would be desirable to have a system that could automatically and controllably test large numbers of devices designed to sense magnetic fields, and more desirable to further be able to control for electrical and temperature effects.

SUMMARY OF THE INVENTION

A testing system according to the present invention tests devices in the presence of a magnetic field repeatably and quickly so that production runs of devices can be tested.

The testing system preferably also includes equipment for performing electrical testing, and is configured so that both electrical input and magnetic input can be provided at one testing location. A magnetic field source, preferably an electromagnetic coil that allows the magnetic field to be controlled and varied to test at multiple known magnitudes, provides a known magnetic field to a device with a magnetic core assembly. The core assembly is integrated into the testing machine in such a way that the magnetic flux is contained but can be passed directly through the device being tested. This containment is accomplished by the configuration of the core assembly and the selection of materials, depending on whether those materials have high permeability or low permeability.

Because of the use of a magnetic field, components of the core assembly should have high permeability, e.g., a maximum D.C. permeability at least on the order of $10^5$, while other components near the device and the core should have permeability close to one (1). Such low permeability materials include plastic and certain types of stainless steel (e.g., the 300 series). In addition, it is desirable for the track or conveyor to have a slit at a location near the device to minimize Lorentz forces that may be induced near the device when the magnetic field changes. This slit is particularly desirable if the magnetic generator is a coil and the magnetic field varies.

The system is preferably configured for surface mount SOIC packages or for dual in-line packages (DIPs).

In a method according to the present invention, a device is brought to a testing location, and electrical conductors are brought into contact with pins from the device to sense output signals in response to input conditions. One or more electrical signals are provided from the conductors to one or more of the pins, and a resulting signal or signals is/are sensed with the conductors in response to the electrical input. One or more known magnetic fields are applied to the device and a resulting signal or signals is/are sensed in response to the magnetic field input. These electrical and magnetic tests are performed sequentially in either order (although preferably magnetic last) while the device is held in one testing location. The method thus allows multiple tests to be performed without moving the device to another location between tests.

The testing system of the present invention can thus provide a controllable and variable magnetic field directly through the device and can contain the generated magnetic field over a wide range of field strengths. The testing system of the present invention can perform electrical and magnetic tests of integrated circuits quickly and at a single location, thus speeding the process per device. The testing system preferably also controls temperature, so the device can be characterized in a uniform temperature environment and over the full temperature range if desired. Other features and advantages will become apparent from the following detailed descriptions, drawings, and claims.

DETAILED DESCRIPTION

Figure 1:
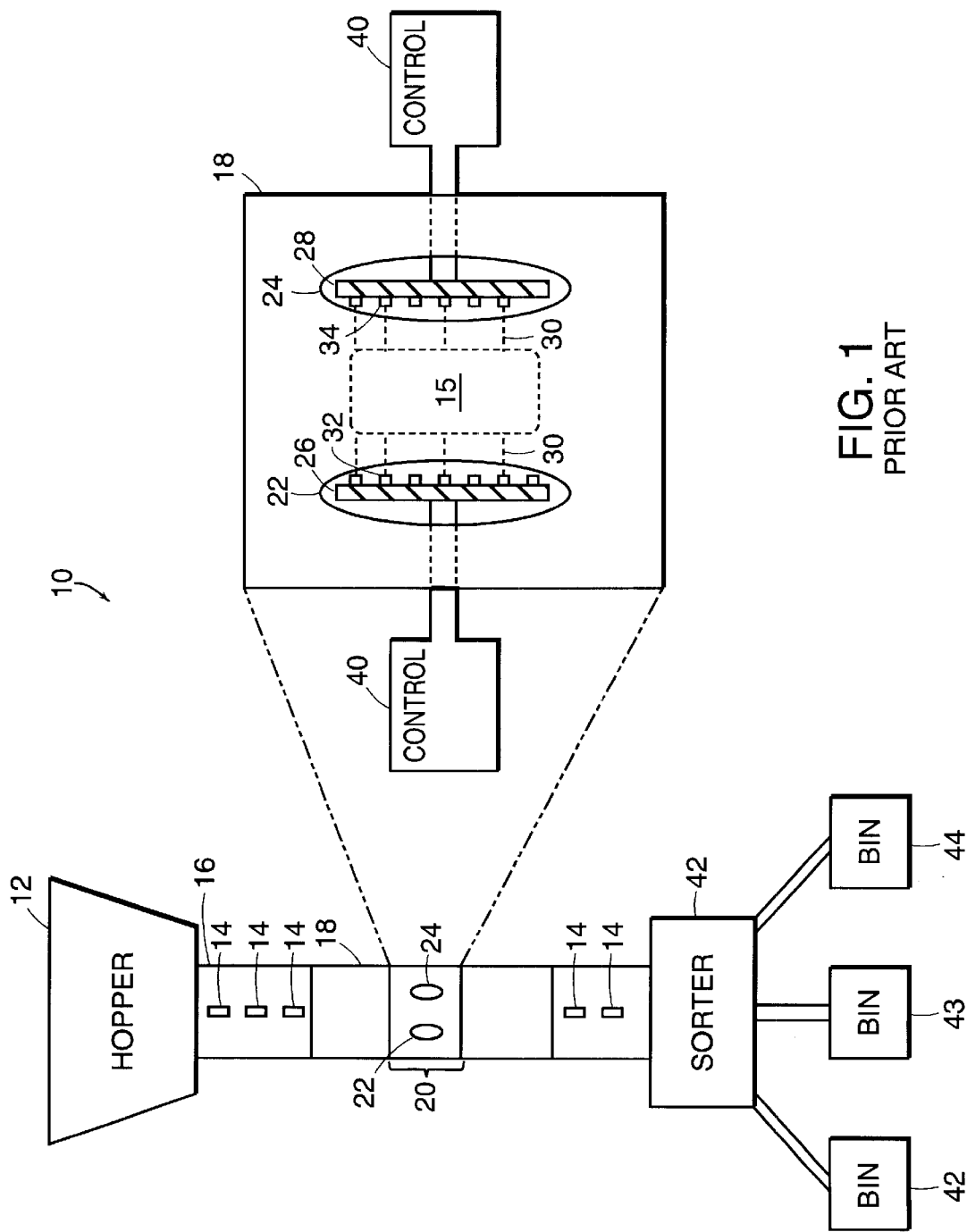
FIG. 1 is a block and pictorial view of a known testing device.

A known type of testing system 10 for testing packaged integrated circuits (ICs) is represented in FIG. 1. Testing systems of this general type are commercially available from Aseco Corporation of Marlboro, Mass., e.g., an Aseco S170 model. Devices 14 that are to be tested are held in a hopper 12. A track 16 carries devices 14 from hopper 12 to a testing area 20. At this testing area, a pin (not shown) holds the device in place. While not shown in FIG. 1, track 16 is actually bowed outwardly at the testing area and curves away in the same direction above and below the testing area. The devices that are represented here are surface mount 8-pin SOIC devices (four pins on each side), although the testing system can be adapted to other types of packaged devices, such as dual in-line packages (DIPs).

Testing area 20 is covered with a track cover 18 that has two vertically elongated slots 22, 24. Testing paddles 26, 28 extend through slots 22, 24 and orthogonally away from track 16. Paddles 26, 28 have conductors (test pads) 32, 34 used to make an electrical connection with pins 30 that extend from device 15. A spring loaded pair of metal bellows (not shown) pushes paddles 26, 28 into and out of contact with pins 30. Electrical testing is performed by providing input signals through conductors 32, 34 to selected ones of pins 30 and receiving output signals from selected ones of pins 30 through conductors 32, 34.

In such devices, testing is performed in an enclosed temperature-controlled chamber that has sensors for sensing the temperature within the chamber and a heating mechanism for providing heat. The device can thus be characterized over a desired temperature range.

The mechanical, electrical, and temperature control are represented generally here as "control" 40, and each of these control functions is generally known. Control 40 can include a programmed microprocessor, general purpose computer, one or more ASICs, or some combination of these components. Control 40 controls the metal bellows to move the test paddles, the heater to control the temperature in response to a temperature sensor, and circuitry for providing input signals and detecting output signals. With appropriate modifications, the control functions can be modified for other types of devices, such as DIPs.

After a device is tested in testing area 20, the pin (not shown) that holds the device is retracted to release the device down track 16 to a sorter 42. Sorter 42 causes the tested devices to be sorted into a number of bins 42–44 (three bins are shown, but there can be more). These bins allow sorting into pass and fail devices, and allow the failed devices to be further subdivided.

Figure 2:
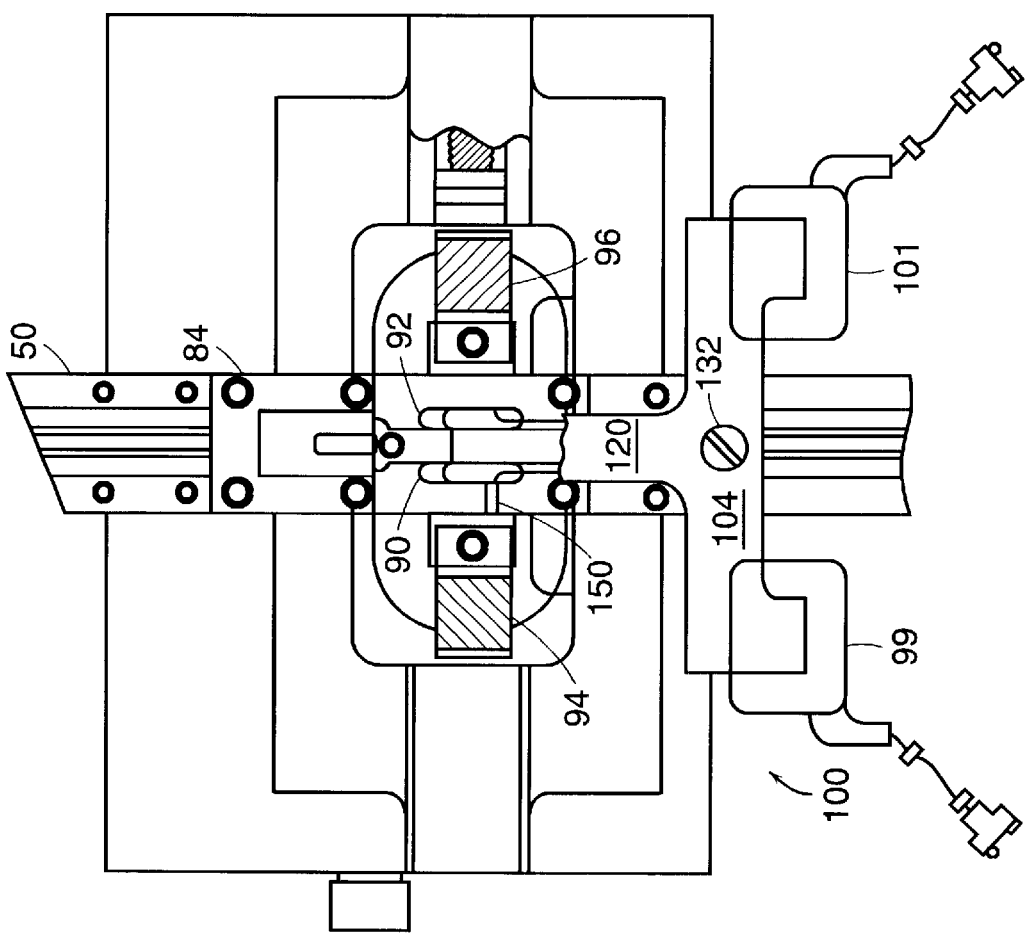
FIG. 2 is a front view of a portion of a testing assembly according to the present invention.
Figure 3:
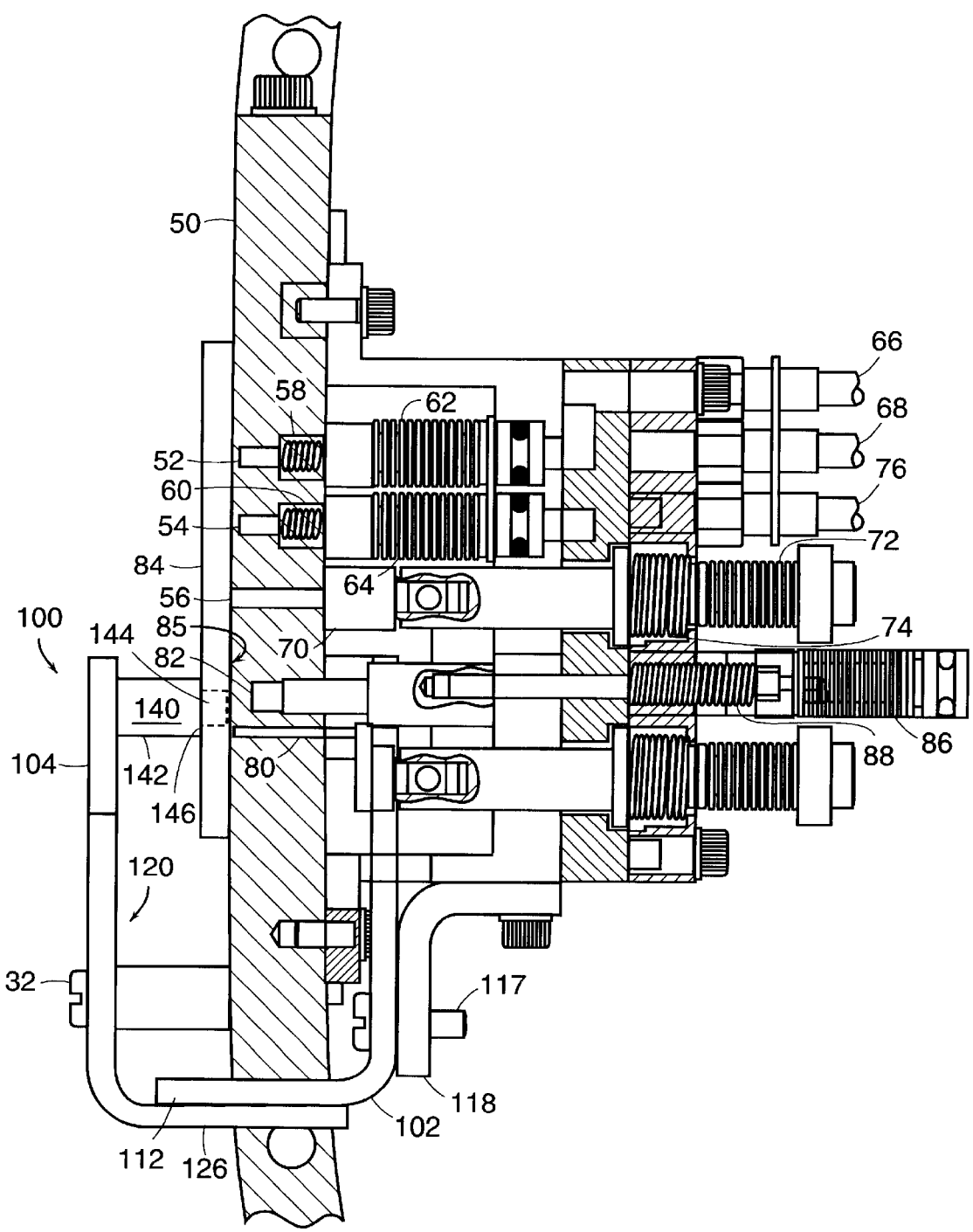
FIG. 3 is a part cross-sectional, part side view of the portion of the testing assembly of FIG. 2.

Referring also to FIGS. 2 and 3, the testing system of the present invention is designed to test devices in the presence of a known magnetic field. Consequently, it is particularly useful for testing devices that sense magnetic fields. The testing system is preferably a modified version of the general type of testing device described above in connection with FIG. 1, to keep the features of electrical testing and temperature control. Like the known system, the testing system of the present invention preferably has a hopper or some other storage for keeping a large number of devices, a track or some other type of conveyor or transporter for providing one or more devices to a testing location, testing paddles or some other set of electrical conductors for making contact with the device to provide and/or receive signals, a sorter for sorting devices after testing, and bins. The principles and features of the present invention are not necessarily limited, however, to any particular type of testing system or packaged device.

In a manner similar to that shown in FIG. 1, the devices to be tested are provided from a hopper along a track 50 in a line so that multiple devices are on track 50 at the same time. Referring particularly to FIG. 3, before reaching the testing location, a device is physically stopped by a series of pins 52, 54, and 56 (FIG. 3). Pins 52, 54, and 56 each stop the devices, thereby effectively pipelining the devices to the testing area. Pins 52 and 54 are moved with springs 58, 60 and metal bellows 62, 64 under control from a controller over electrical lines 66, 68. Pin 56 is also controlled with an actuator 70 that is pushed forward and drawn back with bellows 72 and spring 74 under control over line 76.

Underneath the testing area is a stop pin 80 that stops the device after pin 56, the last pin before the testing location, releases the device. The device hits stop pin 80 and may bounce somewhat before coming to rest, at which time an actuating pin 82 is operated to contact the device to hold the device against a track cover 84 at a testing location 85. Pin 82 is extended and retracted with a bellows 86 and a spring 88.

After the device is thus secured between pin 82 and cover 84 at testing location 85, electrical conductors, such as testing paddles of the type shown in FIG. 1 (but not shown in FIGS. 2 and 3), are brought into contact with the leads from the device to perform electrical testing in a generally known manner. The paddles extend through slots 90, 92 and are controlled in part through bellows 94, 96. After the electrical testing is done, magnetic testing is performed, and then pin 82 is retracted to allow the device to continue down track 50 to a sorter as described in connection with FIG. 1. The magnetic testing could be performed either before or after the electrical testing.

To perform the magnetic testing, a magnetic field is provided by a magnetic core assembly 100 that is made of a high permeability material, such as permalloy 80, which has a D.C. permeability of about 75,000 at B=100 Gauss. Core assembly 100 supports two coils 99, 101 (FIG. 2) at a location near the electrical testing area.

Figure 4:
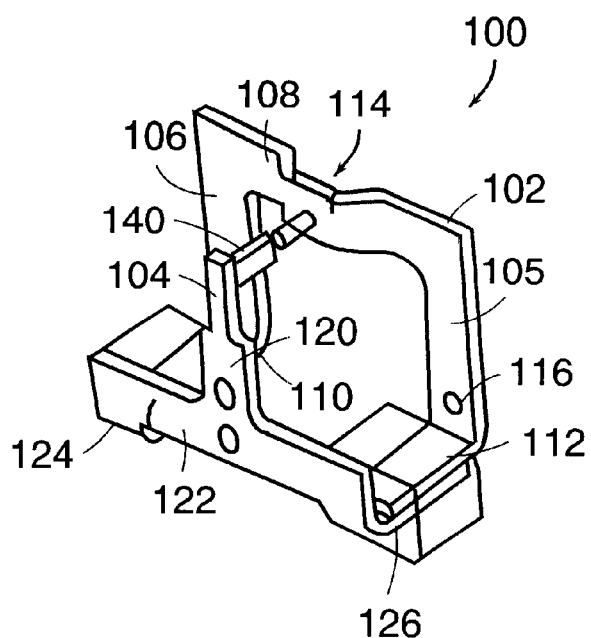
FIG. 4 is a perspective view of a magnetic core assembly.

FIG. 4 is a perspective view showing in more detail core assembly 100 removed from the testing device. Core assembly 100 has a back plate 102 and a front plate 104, each of which is made from a number of laminated layers of high permeability material. The laminated structure provides high permeability, low eddy-current losses, and low hysteresis. While the number of layers can vary, it has been found that a laminate of 7–8 layers is sufficient. These layers are glued together after first being annealed to increase permeability.

Back plate 102 is a single integral member that has two parallel L-shaped legs 105, 106 and a cross piece 108. L-shaped legs 105, 106 have long vertical legs parallel to the track and shorter horizontal legs 110, 112 extending perpendicular to the track. Cross piece 108 connects the tops of the vertical legs, and at its center has a recessed region 114 that is recessed in a direction perpendicular to plate 102. At region 114, an opening receives actuating pin 82, which contacts the device being tested. Each of the longer vertical legs has an opening 116 near its respective horizontal leg for receiving a pin or screw 117 for rigidly mounting back plate 102 to a support bracket 118 (FIG. 3).

Front plate 104 is roughly an inverted T-shape with a vertical post 120 and an integral horizontal cross piece 122, together forming a vertical plane parallel to the track at the testing location. At the ends of cross piece 122 are two horizontal legs 124, 126 extending perpendicular to the cross piece (and the track) and positioned to abut horizontal legs 110, 112 from back plate 102. Post 120 has an opening 130 for receiving a screw 132 for connecting front plate 104 to track 50.

Wrapped around the pairs of horizontal legs of the back plate and the front plate, i.e., legs 112 and 126, and legs 110 and 124, are two coils 99, 101 with many turns. These coils are electrically coupled to a control system that controls the current flowing into the coils, and hence controls the magnetic field, preferably up to 1000 Gauss. The coils are on a bobbin and are provided over the horizontal legs of the back plate before the front plate is mounted to the track. The bobbins are held tightly on the pairs of horizontal legs.

Near the top of post 120 is a high permeability stud 140 that extends horizontally into track cover 84 at a position near the device being tested. Stud 140 can be simply rectangular with a single flat face, or it can have two parallel legs extending toward the device, with one leg longer than the other to create air gaps with different widths.

As best shown in FIG. 3, stud 140 has a larger diameter or diagonal portion 142 and a reduced cross-sectional portion 144 (shown in dashed lines) that forms a shoulder 146. Reduced cross-sectional portion 144 extends into a hole in cover 84, while shoulder 146 contacts the outside of cover 84.

In prior testing devices, a cover for the testing location would typically be made of stainless steel and would include a series of mirrors that were used with fiber optic lines to sense when a device was at a location along the track. According to the present invention, however, the mirror at the actuator pin is omitted while the front surface of the stud, extending into the cover, is polished so that it has a reflective surface. Also, track cover 84 is made of a low permeability material, such as a G-10 machinable plastic. The actuator pin and the stud thus each perform multiple functions, including completing a magnetic circuit.

As shown particularly in FIGS. 3 and 4, back plate 102, front plate 104, actuator pin 82, and stud 140 form a magnetic circuit with the device in a gap between pin 82 and stud 140. The plates, stud, and actuator pin are all made of high permeability materials to form the magnetic circuit. Other materials near this magnetic circuit are made of low permeability or non-permeable materials. In prior testing devices similar to that shown in FIG. 1, there were many components made of stainless steel in the 400 series, which has high permeability. According to the present invention, however, the cover, the components of the support frame, and other components are made of machinable plastic, or of a low permeability stainless steel, such as stainless steel in the 300 series, which has a permeability of about 1.0 at B=20 Gauss. These low permeability components include cover 84, screw 117, bracket 118, and screw 132. The track itself, both in prior testing systems and in the system of the present invention, is made from aluminum with low permeability.

Figure 5:
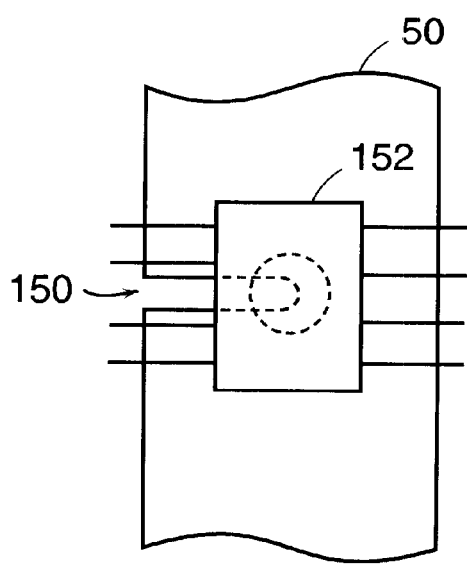
FIG. 5 is a front view of a track, illustrating the use of a slit for preventing Lorenz forces.

Referring to FIGS. 2 and 5, track 50 has a slit 150 along one side and extending at about midway in the vertical direction relative to a device 152 being tested. Slit 150 extends about half the width of track 50 to create a gap that helps to minimize Lorentz forces. (As is well known, a change in a desired magnetic field, including a step function, creates current loops that induce a magnetic field that is opposite to and works against the desired magnetic field.)

A method for using a testing system according to the present invention involves testing both electrical and magnetic characteristics. When a device is brought to the testing location and the actuator pin holds the device in place, electrical tests are performed through the pins. The magnetic test is preferably performed after the electrical test because the magnetic test takes more time and because the results of the electrical test may make magnetic testing unnecessary. To make the magnetic test, one or more magnetic fields are provided around the device, and the upward signal is read from the device to determine whether the device is properly sensing the magnetic field. In one particular example, fields of +400 gauss, and −400 Gauss are applied. The coils allow the magnetic field to be applied rapidly; as a result, the magnetic field testing is very fast, e.g., 100 msec. The magnetic field testing is sufficiently fast to prevent any delay in the system because even with the additional time of the magnetic test, the testing procedures are still faster than mechanical delays in the system.

The testing mechanism can also be used for calibration. In a highly sensitive magnetic field sensor, stresses in the device can create changes in the signal produced from the sensor, even at an external magnetic field of 0. To calibrate the testing device, a device is positioned in the testing area, and a signal is received when the magnetic field equals 0 to determine a zero offset, i.e., the signal that is produced from various magnetic fields introduced by other parts of the circuitry of the testing machine. When this offset is determined, a magnetic field is introduced, and the desired electrical signal is received.

Having described an embodiment of the present invention, it should be apparent that other modifications can be made without departing from the scope of the appended claims. For example, while the magnetic generating assembly has been described for use with a device that tests 8-pin SOIC type packages, it should be understood that principles of the present invention can be applied to handlers for testing other types of devices.

What is claimed is:

1. An automated testing system for testing integrated circuit devices having conductive pins, at least some of the pins being for electrical signals to be provided to and/or from the devices, the system comprising:
    a conveyor for providing a device to a testing location;
    electrical conductors brought into and out of contact with at least some of the pins of the device while the device is held at the testing location, the electrical conductors being used to provide input signals to at least one pin and for receiving output signals from at least one pin; and
    a magnetic circuit including at least one coil for controllably providing a magnetic field with known magnitude to the device while the device is at the testing location, the electrical conductors providing a signal from the device in response to the device sensing the magnetic field, electrical testing and magnetic field testing being performed on the device while the device is at one testing location.

2. The system of claim 1, further comprising a hopper for holding a plurality of the devices, wherein the conveyor includes a track for providing the devices from the hopper to the testing location.

3. The system of claim 1, wherein the magnetic circuit includes a front plate on one side of the conveyor and a back plate on an opposite side of the conveyor, the front and back plates connected together.

4. The system of claim 3, wherein the coil is wrapped around a portion of the front plate and around a portion of the back plate.

5. The system of claim 4, further comprising a second coil, wherein the second coil spaced from the first coil and is wrapped around a second portion of the front plate and around a second portion of the back plate.

6. The system of claim 5, wherein a contact pin for holding the device at the testing location is coupled to the back plate.

7. The system of claim 6, further comprising a stud coupled to the front plate and extending toward the device, the stud and the contact pin defining a gap in which the device is held.

8. The system of claim 7, wherein the conveyor is a track, the system further comprising a cover over the track, the cover having an opening into which the stud extends, the stud being made of a high permeability material and the cover being made of a low permeability material.

9. The system of claim 1, wherein the devices are surface mount SOIC packages, wherein the electrical conductors are on paddles that are located on either side of the device when the device is in the testing location, and wherein the magnetic circuit includes a back plate on one side of the conveyor, a front plate on the opposite side of the conveyor, a first pin for holding the device in the testing location and coupled to one of the front and back plates, and a second pin coupled to the other of the front and back plates.

10. An automated testing system for testing integrated circuit devices with pins at a testing location by sensing output signals in response to input conditions, the testing system comprising:
    means for providing electrical signals to at least some of the pins of a device being tested;
    means for sensing signals from at least some of the pins to test the device in response to electrical signals as the input condition; and
    means for providing to the device different magnetic fields having known magnitudes while the device is at the testing location, the sensing means sensing signals in response to the magnetic fields as the input conditions.

11. The system of claim 10, further comprising means for transporting a large number of the devices one at a time to the testing location.

12. The system of claim 10, wherein the means for providing different magnetic fields includes a magnetic circuit having two coils, plates on opposite sides of the device when at the testing location, and pins on opposite sides of the device when at the testing location.

13. A system for performing magnetic testing on a packaged integrated circuit device, the system comprising:

a track designed for transporting packaged integrated circuit devices along a first direction to a testing location; and a magnetic circuit mounted at least close to the track for providing a controllable variable magnetic field to the packaged integrated circuit device at the testing location;

the track having a slit in a direction transverse to the first direction, the slit creating a physical gap in a portion of the track at the testing location.

14. The system of claim 13, wherein the magnetic circuit is made of a high permeability material and the track is made of a low permeability material.

15. A method for performing both electrical and magnetic testing on integrated circuit devices having electrical leads, at least some of which are for electrical signals to be provided to and/or from the device, the method comprising:

receiving one of the integrated circuit devices at a testing location, the device being one of a number of devices provided sequentially and automatically from a source with multiple devices;

holding the integrated circuit device at the testing location;

electrically testing the device at the testing location by introducing an electrical signal into at least one of the electrical leads of the device and by sensing an output signal at one or more of the electrical leads; and magnetically testing the device at the testing location by providing to the device first and second magnetic fields having known and different magnitudes and sensing an output signal from at least one of the electrical leads.

16. The method of claim 15, wherein the electrical testing is done before the magnetic testing.

17. The method of claim 15, wherein the electrical testing is done after the magnetic testing.

18. The method of claim 15, wherein the magnetic testing and electrical testing are performed one after the other on a device without moving the device between tests.

19. The method of claim 15, wherein receiving a device includes receiving a surface mount SOIC packaged device with pins extending away from opposite sides.

20. The method of claim 19, wherein the electrical testing includes bringing paddles with electrical conductors into contact with each side of the device.

* * * * *